US005714011A

United States Patent [19]

Schneider et al.

[11] Patent Number: 5,714,011
[45] Date of Patent: Feb. 3, 1998

[54] DILUTED NITROGEN TRIFLUORIDE THERMAL CLEANING PROCESS

[75] Inventors: Charles Anthony Schneider, Gilbert; Ronald James Gibson, Chandler; Bruce Alan Huling, Buckeye; George Martin Engle, Scottsdale, all of Ariz.

[73] Assignees: Air Products and Chemicals Inc., Allentown, Pa.; Aspect Systems Inc., Chandler; GEC Inc., Tempe, both of Ariz.

[21] Appl. No.: 390,716

[22] Filed: Feb. 17, 1995

[51] Int. Cl.$^6$ ............................ B08B 5/00; B08B 5/02; B08B 5/04
[52] U.S. Cl. ............................. 134/21; 134/25.4
[58] Field of Search ..................... 134/1.3, 2, 3, 21, 134/31, 37, 25.4

[56] References Cited

U.S. PATENT DOCUMENTS

| 4,488,506 | 12/1984 | Heinecke et al. | 118/667 |
|---|---|---|---|
| 4,655,800 | 4/1987 | Tsukada et al. | 55/195 |
| 4,886,444 | 12/1989 | Hirase et al. | 431/5 |
| 5,294,262 | 3/1994 | Nishimura | 134/22.1 |
| 5,421,902 | 6/1995 | Odajima et al. | 134/19 |
| 5,421,957 | 6/1995 | Carlson et al. | 134/1.1 |

FOREIGN PATENT DOCUMENTS

| 418592A1 | 3/1991 | European Pat. Off. | C23C 16/44 |
|---|---|---|---|
| 1306580 | 11/1989 | Japan | C23F 4/00 |
| 1306580 | 2/1990 | Japan | C23C 16/54 |
| 2183204 | 6/1987 | United Kingdom . | |

OTHER PUBLICATIONS

"Utilizing a portable cycle purge nitrogen venturi for removal of process gases in semiconductor processing gas systems." J. P. Fournier and Michael E. Elta; J. Vac. Sci. Technol. A 10(5), Sep./Oct. 1992; pp. 3376, 3377.

J. P. Fournier and Michael E. Elta (Fournier et al.) "Utilizing a Portable Cycle Purge Nitrogen Venturi for Removal of Process Gases in Semi–Conductor Processing Gas Systems."; J. Vac. Sci. Technol. A 10(5), Sep./Oct. 1992; pp. 3376, 3377.

*Primary Examiner*—Zeinab El-Arini
*Attorney, Agent, or Firm*—Geoffrey L. Chase

[57] ABSTRACT

A method for the dynamic cleaning of semiconductor fabrication equipment and particularly quartzware with thermally activated diluted nitrogen trifluoride at elevated temperatures, typically at the process operation temperature, wherein the cleaning effluent is safely removed and cleaning by-products isolated or diluted to provide for efficient cleaning and rapid restarts of fabrication equipment so cleaned.

11 Claims, 2 Drawing Sheets

DILUTED NITROGEN TRIFLUORIDE THERMAL CLEANING PROCESS

TECHNICAL FIELD

The present invention is directed to the field of thermal cleaning with diluted nitrogen trifluoride etchant. More specifically, the present invention is directed to cleaning various silicon-containing semiconductor substances from wafers and chemical vapor deposition equipment, including quartz vessels and hardware, using a dynamic flow of diluted nitrogen trifluoride at elevated temperatures with a unique process.

BACKGROUND OF THE PRIOR ART

The semiconductor industry has experienced a long-felt need to solve the problem of cleaning chemical vapor deposition furnaces and quartz tubes in the furnaces as well as quartz hardware of various undesired substances such as silicon nitride, polycrystalline silicon; titanium silicide, tungsten silicide and various other silicides, as well as silicon dioxide, which are typically present as undesired films on furnaces and quartz hardware during their deposition on silicon wafers and chips being processed as electronic materials and integrated circuits.

The normal procedure for cleaning is to remove the parts, such as those made of quartz, metals or other materials from a furnace, such as quartz furnace tubes, and perform a wet chemical cleaning. O-ring seals would typically have to be replaced in such an operation, as well as cleaning of lines, doors and other vacuum components. Another alternative is to use another piece of equipment and perform a plasma cleaning. The wet chemical cleaning is very costly and time consuming. When the equipment is shut down to pull the quartz parts, it can require up to 18 hours of time. Also, the system necessitates reverification for its operating integrity before it can be used again. Direct cleaning application requires special chemicals, equipment and sinks to perform this cleaning. Another disadvantage is that the quartzware is attacked at accelerated rates which affects its reproducibility and reliability of operation. This is especially true when cleaning quartz racks or wafer holders. These components have special slots cut in the quarts to hold the parts being coated, and when the wet chemical clean attacks the quartz, it affects the dimensions of these slots. When the slots are affected, the parts being held are not coated uniformly, which requires the quartz be replaced at accelerated scheduling.

The plasma cleaning method requires the use of another piece of equipment especially designed to perform a cleaning of quartz tubes in place within the chemical vapor deposition furnace equipment. First, the plasma cleaning method does not clean the other quartz parts which are used in the chemical vapor deposition furnace system. This means these parts will need to be chemically wet cleaned, separate and apart from plasma cleaning methods. Also, the plasma cleaning equipment takes up space in the manufacturing area, and may prevent other tubes from being used in the system while it is being utilized. If the quartz parts are replaced with another material like silicon carbide, it will make the plasma system application unreliable.

Methods of using nitrogen trifluoride have been attempted but never have been brought to the marketplace. One such method was performed in a static mode that allowed by-products to condense on the cooler walls of the system. This caused a dangerous condition when these by-products were not evacuated before returning the system to the atmosphere. This called for extended purging times and reduced the benefits of this method. It also allowed for possible dangerous gas mixtures to develop in the system's vacuum components that may mix with gases which are normally utilized to deposit films on the wafers. One nitrogen trifluoride cleaning method is discussed in UK Patent Appln. GB2183204 where nitrogen trifluoride is used in a static mode and suggestion for use in a continuous flowing mode is also set forth. This patent application does not address the means or methods for removing cleaning by-products, the treatment of by-products once removed or the use of nitrogen trifluoride with any other gases.

The prior art has failed to address a commercially successful process for cleaning semiconductor materials or equipment using a gaseous source to produce volatile cleaning by-products which are readily removed from the materials or equipment after cleaning is accomplished. In addition, the prior art has not addressed a viable method for removal of cleaning by-products and collection of such by-products (which typically may be reactive and toxic) for safe, easy disposal when servicing chemical vapor deposition equipment and materials treated in such equipment. The prior art has not addressed a method for using nitrogen trifluoride in combination with other gases so as to permit elevated furnace temperatures with controlled etch rates and with minimum down time for etch cleaning. The present invention as set forth below overcomes these drawbacks of the prior art.

BRIEF SUMMARY OF THE INVENTION

The present invention is a process for cleaning materials and/or equipment surfaces in semiconductor manufacturing using diluted nitrogen trifluoride, comprising:

(a) initially evacuating a zone contacting the materials and/or equipment surfaces;

(b) maintaining the zone at an elevated temperature sufficient to disassociate nitrogen trifluoride;

(c) flowing a mixture of nitrogen trifluoride and an inert gas through the zone, the mixture in the range of approximately 2%:98% to 70%:30%, of the nitrogen trifluoride:inert gas, respectively, wherein the inert gas is selected from the group consisting of nitrogen, argon, helium, and mixtures thereof;

(d) cleaning undesired substances on the materials and/or equipment surfaces by chemical reaction of the nitrogen trifluoride and/or fluorine cleaning reagents disassociated from nitrogen trifluoride with the substances to form volatile reaction products, and;

(e) removing the volatile reaction products, any remaining nitrogen trifluoride and inert as waste products from the zone by subsequent evacuation of the zone wherein the waste products are evacuated through a heated exhaust conduit.

Preferably, the elevated temperature of step (b) is in the range of approximately 550° to 1000° C.

More preferably, the elevated temperature of step (b) is in the range of approximately 600° to 900° C.

Most preferably, the elevated temperature of step (b) is in the range of approximately 620° to 850° C.

Preferably, the waste products are evacuated using a pressurized gas vacuum venturi.

Preferably, the pressurized gas is heated prior to passing through the vacuum venturi.

Alternatively, the waste products are evacuated using a mechanical vacuum pump.

Preferably, the waste products are evacuated to a cold trap wherein the waste products are captured in the cold trap.

Preferably, the cold trap is subsequently isolated from the zone and the cold trap is further evacuated to remove the waste products from the cold trap for disposal.

Preferably, the waste products are diluted with the pressurized gas.

Preferably, the waste products are scrubbed and vented.

Preferably, the pressurized gas is selected from the group consisting of nitrogen, argon, helium and mixtures thereof.

Preferably, the zone is purged with an inert gas after the subsequent evacuation.

Preferably, the initial evacuation is at a pressure of no greater than 200 torr, the flow of diluted nitrogen trifluoride is at a pressure of no greater than 750 torr and the heating is at a temperature of no greater than 850° C.

DETAILED DESCRIPTION OF THE INVENTION

Figure 1:
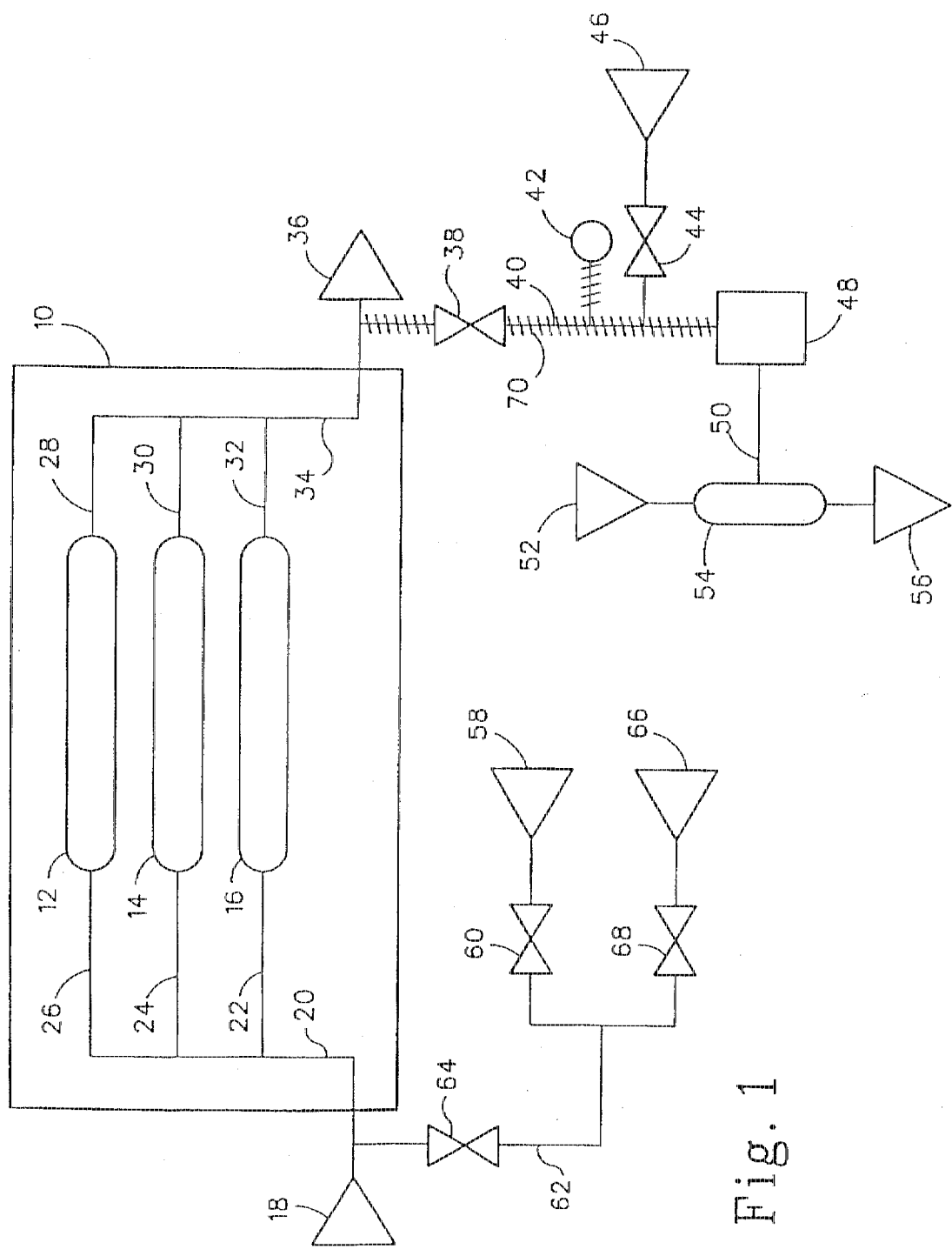
FIG. 1 is a schematic illustration of an embodiment of the cleaning apparatus of the present invention using a cold trap and a vacuum venturi.

A process has been developed for in-situ cleaning of process chambers, boats and/or puzzle pieces in a semiconductor electronic fabrication facility using diluted nitrogen trifluoride at elevated temperature. The present invention uses, preferably, a vacuum venturi with heated process lines and means to heat and temperature control a pressurized gas as a motive fluid for the venturi to remove the waste products of the cleaning from a process chamber, or alternatively, a vacuum venturi pump and a cold trap apparatus with heated process lines connecting the cold trap to the process chambers, etc. for remote pumping and simultaneous exhaust dilution of waste products of cleaning. A mechanical rotary or reciprocating vacuum pump can also be used as the vacuum means, with heated process lines. Cleaning is performed with thermal energy to decompose diluted nitrogen trifluoride gas for generation of fluorine cleaning reagent. The present invention uses a dynamic pressure control to clean the deposition materials from the previously coated material or equipment surfaces, such as quartz hardware. The present invention is also capable of cleaning components downstream of a process chamber outside an elevated temperature or thermal zone. The present invention can be retrofitted to existing semiconductor process deposition equipment, integrated into new equipment, or can be built as a stand-alone process tool for cleaning of parts.

The present invention reduces the cost to clean commonly used quartzware parts and metal roughing lines used in semiconductor and electronic manufacturing equipment by allowing their surfaces to be cleaned in-situ without removal of surfaces from the process system and without reduction in the temperature that the equipment operates at under normal operation. This is uniquely possible with the process of the present invention because the nitrogen trifluoride, which would otherwise be overly aggressive as an etchant in its pure form, is diluted with an inert gas such as nitrogen, helium, argon or mixtures thereof, during use so that the nitrogen trifluoride can be used at existing process operating temperatures. This is a significant benefit because process equipment downtime is critical to economic operation and cooling process equipment to a safe temperature for use of pure nitrogen trifluoride and subsequent reheating to process temperatures requires typically several hours. These cooling and heating time periods are successfully and uniquely eliminated with the diluted nitrogen trifluoride etch-clean process of the present invention.

The present invention does not require a retrofit that utilizes a radio frequency power supply and means of applying radio frequency to surfaces for activation energy to decompose nitrogen trifluoride to produce cleaning reagent. The present invention also does not require the existing system pumping apparatus to be used to remove cleaning effluent. The present invention also eliminates the use of other equipment used for current methods of cleaning such as to remove quartzware or roughing lines for cleaning in aqueous acids and deionized water in large, semi-automated ventilated tanks. The present invention eliminates what chemical wastes and possible operator exposure to hazardous acids and solvents used in current cleaning systems.

The present invention involves cleaning a typical process chamber including the parts arrayed within a chamber of a semiconductor or electronic fabrication facility by evacuating the chamber using a pressurized gas vacuum venturi, preferably supplied with heated and temperature controlled gas to provide a vacuum pressure of about 100 torr. Nitrogen trifluoride diluted with an inert gas such as nitrogen, argon, helium or mixtures thereof to a range of 2%:98% $NF_3$: inert up to 70%:30% $NF_3$: inert, more preferably 10%:90% to 30%:70% $NF_3$: inert, and most preferably 10%:90% $NF_3$: inert, is then introduced via a gas supply means, such as a gas control manifold, into the process chamber and associated roughing manifold and the cleaning process is conducted at a pressure in the range of about 400–700 torr using the thermal energy of approximately 550° to 1000° C., preferably 600° to 900° C., more preferably 620–850° C. available from the existing equipment heating system to decompose or disassociate the nitrogen trifluoride and produce a fluorine cleaning reagent, such as ionic or free fluorine. The fluorine cleaning reagent produced from the decomposition or disassociation of nitrogen trifluoride under thermal degradation are effective against deposits of silicon nitride, polycrystalline silicon, titanium silicide, tungsten silicide, refractory metals and their various silicides. The fluorine cleaning reagent produced from the decomposition or disassociation of nitrogen trifluoride has minimal effect on quartz tube furnaces or quartzware used within such furnaces.

Upon completion of the cleaning process, the diluted nitrogen trifluoride source is turned off and the system pumped via the pressurized gas vacuum venturi, preferably with heated and temperature controlled pressurized gas, for 15 minutes followed by a purge with nitrogen for at least one-half hour while under vacuum. The cleaned process chamber is then isolated from the cleaning apparatus comprising a nitrogen trifluoride source and pressurized gas in vacuum venturi evacuation system and is evacuated and cycle purged using nitrogen while using the process chamber's own pumping system for approximately one-half hour prior to the return of service in the semiconductor or electronic fabrication procedure.

The most significant feature of the present invention is that the process is executed in a dynamic flow mode using diluted nitrogen fluoride at process temperatures and operated by a nitrogen or other pressurized inert gas driven vacuum venturi pump. Preferably, the pressurized inert gas is heated and temperature controlled to be above the condensation temperature of the waste products, such as 100° C. The advantage of this type of a pump ensures that minimal cleaning gas effluent, nitrogen trifluoride and its degradation products, may come into contact with the process equipment system pumping stack. This provides a safe, efficient and effective process and apparatus for the cleaning of process chambers or zones and supporting fixtures and appliances included in such chambers and zones as well as materials such as wafers. Because the nitrogen trifluoride is diluted with inert gas prior to its use in etch-cleaning, the waste products are also advantageously further diluted with the initial inert gas so as to lessen the requirement for scrubbing and downstream process equipment corrosion design.

Typically the nitrogen trifluoride can be thermally activated to degrade and produce the fluorine cleaning reagent at elevated temperatures between 550° C. and 1000° C., preferably 600° to 900° C., more preferably 620° C.–850° C. When etch-cleaning polysilicon, it is desireable to operate at approximately 620° C., while etch-cleaning silicon nitride is desireably performed at approximately 800° C.

In addition, the use of the pressurized gas vacuum venturi, preferably with heated and temperature controlled pressurized gas, to induce vacuum during the cleaning procedure prevents possible dangerous gas mixtures, such as silicon hydride, oxygen and hydrogen from developing due to residual gases left in the process chamber's vacuum pumps. The use of heated evacuation lines, such as by heating tape, along with the dynamic method of flowing nitrogen trifluoride during the cleaning process, allows by-products from the cleaning cycle to be evacuated from the process chamber and not condense on cooler surfaces of the main vacuum system of a process chamber, thus preventing past problems and safety concerns associated with the use of nitrogen trifluoride as a cleaning gas. The pressurized gas vacuum venturi may work off a high pressure gas, such as nitrogen or argon, or any high pressure gas compatible with the system materials. The vacuum venturi may itself be heated or the gas used to create the vacuum may be heated, such as by heat tape on the conduits leading the gas into the venturi. In addition, by using the vacuum venturi operated by the pressurized gas, such as an inert gas, the process and apparatus of the present invention provides a natural dilution for the exhaust gases emanating from the cleaning of a process chamber with nitrogen trifluoride. This provides a safer exhaust method than past methods have utilized, by using an independent vacuum exhaust system from the vacuum system typically provided for a process chamber of a semiconductor manufacturing facility.

In an alternative embodiment, the present invention also can use a cold trap, typically operated with cooling water, to condense volatiles removed by the cleaning operating using nitrogen trifluoride. Mechanical refrigeration can also be used to operate the cold trap, or alternatively cryogenic fluids can be used. By passage of such cleaning exhaust through heated vacuum lines to a cold trap, it is possible to isolate these toxic or reactive volatiles of the cleaning process in a centralized location for appropriate treatment and disposal. Any volatiles which do not condense in the cold trap are highly diluted by the pressurized gas in a vacuum venturi and can be subjected to further scrubbing in appropriate stack apparatus as is traditional in the industry. When a cold trap is used prior to a vacuum venturi or mechanical vacuum pump, it is not necessary to heat the vacuum venturi or its motive gas or the mechanical vacuum pump because the bulk of the condensable waste products are removed in the cold trap.

With reference to the drawing in FIG. 1, an embodiment of the present invention will now be set forth. A semiconductor manufacturing furnace 10 is illustrated containing, for example, 3 parallel quartz furnace tubes 12, 14 and 16 where various chemical vapor deposition processes are conducted on materials placed within the quartz tubes typically in various quartzware appliances or wafer carriers. Process gas is introduced from source 18 through manifold 20 and by various valves not illustrated through lines 22, 24 and 26 to the respective quartz tubes. Exhaust gases are collected in lines 28, 30 and 32, again appropriately valved but not illustrated, and centrally removed in manifold 34 to appropriate evacuation, scrubbing and downstream processing 36 of a typical semiconductor manufacturing facility.

During the course of chemical vapor deposition of materials in the quartz tubes, deposition occurs on various appliances and carriers within the quartz tubes, as well as on the quartz tube surfaces themselves. At some point in time one or more of the appliances and/or tubes must be taken out of service for cleaning. Although in the present illustration the cleaning process will be exemplified by all of the quartz tubes being cleaned simultaneously, it is understood by appropriate manifolding, a quartz tube or appliances may be independently or separately cleaned while other tubes remain in service.

After the furnace 10 is removed from manufacturing service for cleaning, pressurized nitrogen gas from source 52 is introduced by an appropriate valved conduit into a vacuum venturi 54 and exhausted through downstream scrubbing and vent system 56. This induces a vacuum in line 50 and the illustrated upstream equipment to produce a vacuum in the quartz tubes 12, 14 and 16. The tubes are maintained at an elevated temperature of approximately 620°–850° C., or preferably the process temperature normally used in the tube so as to avoid the time and inconvenience of cool down or heat up, by the traditional heating system of furnace 10 used during normal manufacturing processes.

Diluted nitrogen trifluoride from a source 58 is introduced through open valve 60, line 62 and open valve 64 through manifold 20 and one or all of the connecting lines 22, 24 and 26 of the quartz tubes. During this time by appropriate valving not illustrated, process gas from source 18 is turned off. The diluted nitrogen trifluoride in the dynamic flowing mode at elevated temperature sufficient for thermal degradation of the nitrogen trifluoride to appropriate species of fluorine cleaning reagents attacks the previously deposited substances from the chemical vapor deposition of the processing manufacturing cycle to remove those substances as volatile by-products. The fluorine cleaning reagent produced by thermal degradation of nitrogen trifluoride has high reactive activity with silicon nitride chemical vapor deposition layers and polysilicon chemical vapor deposition layers, but has minimal reactivity with the quartz tubes or quartzware used as appliances and racks in the tubes. The reaction by-products from cleaning, the dilution gases, and any undisassociated nitrogen trifluoride are removed in lines 28, 30 and 32 by the action of the vacuum venturi and collected in manifold 34.

However, rather than being removed through the traditional downstream processing system 36, that system is isolated by appropriate valving not illustrated and the cleaning effluent gases or waste products are removed through heated (heat traced or heat taped 70) exhaust conduit 40, by open valve 38, wherein pressure is monitored by pressure gauge 42. The heat tracing 70 provides a heated line outside the elevated temperature furnace 10 so that volatiles in the cleaning effluent or waste products do not condense, but are removed to a cold trap 48 operated by cooling water or appropriate refrigeration means. The heat tracing is powered by appropriate electrical elements or resistance wires. The cold trap condenses most cleaning exhaust volatiles before removal by various collection means, filtration or change out of appropriate getters or adsorbents. The uncondensed components of the cleaning effluent or waste products are removed in line 50 to the vacuum venturi 54 where the remaining cleaning exhaust or waste products are highly diluted with 60 to 100 liters of pressurized nitrogen gas and removed by a downstream scrubbing and vent system 56 of traditional arrangement.

After appropriate cleaning time is provided, valve 60 is closed and valve 68 is opened to provide a purge with an appropriate gas, such as inert nitrogen, from source 66 to flow through the piping system and the quartz tubes and again removed through the conduit 40, cold trap 48 and vacuum 54 for disposal in an appropriate scrubber and vent system 56. Similar purge gas can be provided through valve 44 and source 46 to clean the cold trap and vacuum venturi when they are isolated by valve 38 being closed. At the end of the purge, valve 68 is closed as well as valve 64 and the system can be further evacuated using the vacuum venturi 54.

Figure 2:
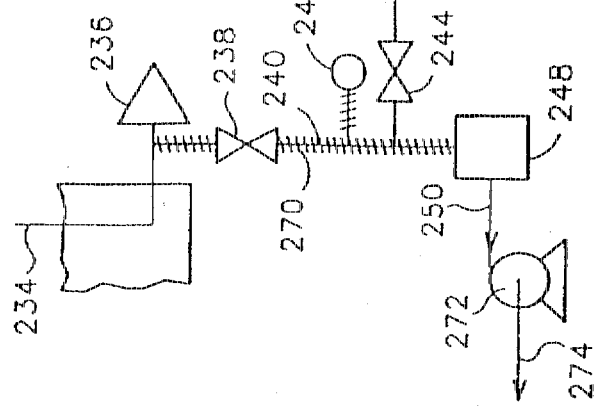
FIG. 2 is a partial schematic illustration of an alternative to the FIG. 1 embodiment of the cleaning apparatus of the present invention shown in FIG. 1 wherein vacuum is provided by a mechanical vacuum pump.

An alternative embodiment is illustrated partially with reference to FIG. 2. In FIG. 2, the portion of the downstream system from line 34 of FIG. 1 is shown with corresponding part numbers in the 200 series. Waste products comprising reaction by-products and any undisassociated nitrogen trifluoride is removed in manifold 234 and bypasses the traditional system vacuum pump or downstream venting 236. Valve 238 is opened in heat traced 270 line 240 to remove the waste products to cold trap 248 which is supplied with vacuum from a traditional mechanical vacuum pump 272 connected to the cold trap 248 through line 250. The evacuated gas is treated in a downstream vent or scrubbing system via line 274. Pressure is monitored through gauge 242 and purge gas from 246 can be provided when valve 238 is closed by opening valve 244.

Figure 3:
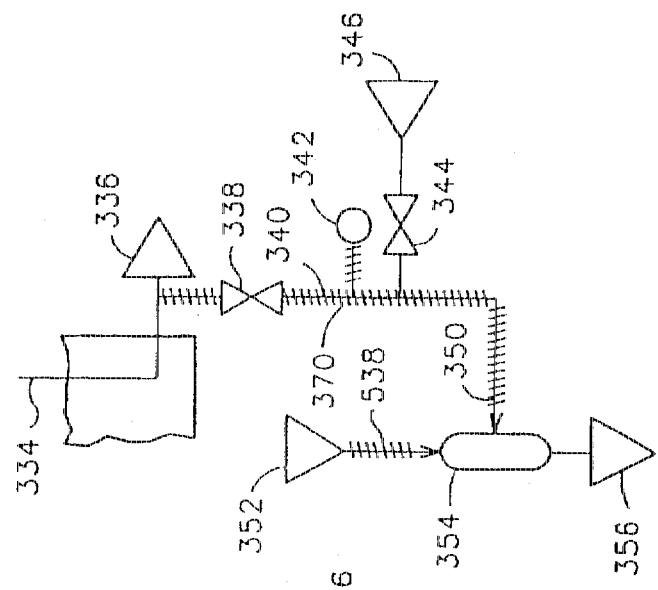
FIG. 3 is a partial schematic illustration of a preferred embodiment of the cleaning apparatus of the present invention shown in FIG. 1 wherein no cold trap is utilized and a heated gas is used in the vacuum venturi.

A preferred embodiment of the present invention is set forth in FIG. 3 which is a partially illustration of the downstream system of FIG. 1. With reference to FIG. 3, manifold 334 corresponds to manifold 34 of FIG. 1 and the same upstream equipment is assumed to exist for the FIG. 3 embodiment. From the traditional downstream processing equipment 336, a heat traced 370 line 340 is controlled through valve 338 to remove waste products of the cleaning process. Pressure can be sensed through gauge 342. The waste products in line 350 enter the vacuum venturi 354 by the suction induced by the motive pressurized gas (i.e., nitrogen) from source 352, which is heated by heat tracing 358. Alternatively, the pressurized gas can be heated in some other manner before it enters the venturi or the venturi itself can be heated. The heating and temperature control is designed to avoid condensation of corrosive or clogging waste products on the equipment before entering a downstream vent or scrubbing system 356, such as a water scrubber.

Figure 4:
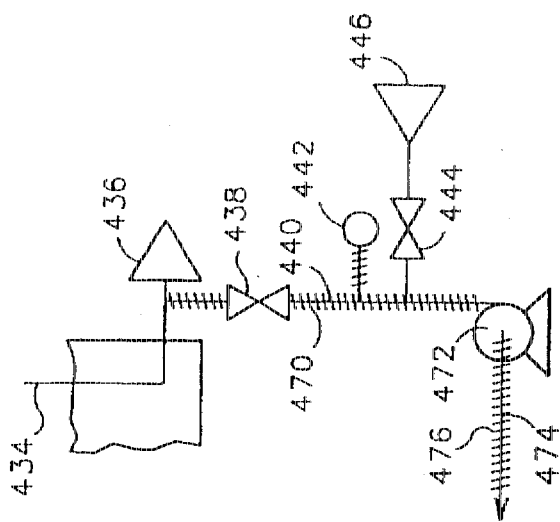
FIG. 4 is a partial schematic illustration of an alternative to the FIG. 1 embodiment of the cleaning apparatus of the present invention shown in FIG. 1 wherein no cold trap is utilized and a heated mechanical vacuum pump and disposal lines are used.

A further embodiment of a downstream system used with the system shown in FIG. 1 upstream of manifold 34 is shown in FIG. 4 where manifold 434 corresponds to manifold 34 of FIG. 1. The upstream equipment is the same as described for FIG. 1 and only the downstream equipment is changed and will be described here. Waste products are removed from the furnace being cleaned in manifold 434 and rather than being removed in traditional downstream system 436, the waste products are removed in heat traced 470 line 440 by opening valve 438. Pressure is sensed in gauge 442. Vacuum is induced in a mechanical vacuum pump 472 which is kept above the condensation temperature of the waste products and the discharge of the pump 472 passes through a heat traced 476 line 474 to an appropriate vent or scrubber. Again, water scrubbing is probably appropriate for the anticipated waste products of this nitrogen trifluoride cleaning. Purging of the downstream equipment can be accomplished through valve 444 and purge gas source 446.

Appropriate venting, gettering or scrubbing, such as water scrubbing, can be used as the disposal means to which the vacuum venturi or mechanical vacuum pump discharges the waste products of the cleaning operation. It is possible that a dedicated disposal device can be used or if appropriate the house disposal device of the facility where the invention is used can be used if it is appropriate to the type and amount of the waste products.

Having described the present invention with regard to a preferred embodiment, it is apparent that the diluted nitrogen trifluoride cleaning process of the present invention provides a number of benefits over the prior art, including: the ability to clean system components in place; reduction in maintenance down time for cleaning; lower cost of - cleaning and capital investment to effect appropriate cleaning procedures; the elimination of wet chemical cleaning materials and procedures; providing a cleaning method which does not require recalibration of the process chamber or furnace of the semiconductor fabrication facility prior to reinitiation of production runs; provision of a safe method for cleaning by using an isolated evacuation system from the manufacturing process apparatus vacuum system; providing a beneficial method of cleaning system quartzware and boats with minimal damage and handling; providing a method to insure fast by-product removal and economic cleaning process cycles, and providing a method which allows for automatic dilution of cleaning exhaust or effluent with an inert dilution gas, such as nitrogen, helium or argon, while providing for a source of vacuum. In addition, the cleaning method of the present invention can be used to clean other types of process equipment, including stand alone cleaning equipment, stainless steel door flanges, vacuum conduits, exhaust piping, equipment of stainless steel, aluminum and ceramic, etc.

Dilution of the nitrogen trifluoride with inert gas provides the advantage of using less nitrogen trifluoride, avoiding unsafe concentration levels of nitrogen trifluoride, etch-cleaning at furnace process temperatures rather than a temperature chosen for safety of concentrated or pure nitrogen trifluoride, and providing natural dilution of the etch waste products.

In addition, although actual etch time is increased with diluted nitrogen trifluoride over concentrated or pure nitrogen trifluoride, the total time required to be off-line from process operation is shorter using the diluted nitrogen trifluoride of the present invention at elevated or process temperatures, because of the elimination or significant reduction in the lengthy time to cool a furnace and reheat the furnace for safe temperature operation if concentrated or pure nitrogen trifluoride were used. Maintaining a furnace at steady-state temperatures is also more advantageous for the useful life of an expensive quartz furnace tube, wherein the stress of significant temperature changes is avoided.

The present invention using a diluted nitrogen trifluoride process also unexpectedly experiences greater selectivity between the film being etched and the quartz furnace tube being cleaned. Although not wanting to be held to any particular theory, it is believed that in the presence of inert gas and under the correspondingly lower partial pressures of nitrogen trifluoride, nitrogen trifluoride produces less $F_2$ upon decomposition and more free fluorine. The $F_2$ species tends to etch quartz, while the free fluorine tends to etch silicon films. Review of the etch cleaned surfaces using pure nitrogen trifluoride and diluted nitrogen trifluoride shows a less desirable surface with the pure etchant and a more desirable surface, similar to HF etch surfaces of the industry standard, with the diluted nitrogen trifluoride of the present invention.

The higher temperatures acceptable with the diluted nitrogen trifluoride, in contrast to pure nitrogen trifluoride, favors the more active etch of films by the fluorine etch species, which reduces etch times relative to dilution effects. An inverse relationship exists between temperature of the etch-clean process and nitrogen trifluoride concentration. At lower concentrations of nitrogen trifluoride, higher temperatures can be used in the etch-clean process of the present invention. In this way, the diluted nitrogen trifluoride process of the present invention can be uniquely implemented to take advantage of a wide range of temperatures, preferably a temperature matching the operating temperature of a particular furnace.

The effluent levels of the higher temperature diluted nitrogen trifluoride process of the present invention will have a lower nitrogen trifluoride component, making the process more environmentally sound. Tests on a pure nitrogen trifluoride process are estimated to be 85%–90% efficient. The nitrogen trifluoride etch in a plasma, rather than thermally, is estimated to be 50% efficient. The present invention using diluted nitrogen trifluoride at high temperature is estimated to be 90%–98% efficient, possibly eliminating the need for thermal cracking abatement of the waste product effluent from the etch clean process. The other effluent waste products are water scrubbable. This would provide yet an additional advantage of the present invention over the prior art of etch cleaning.

Finally, the potential for exothermic runaway with nitrogen trifluoride, which can occur with concentrated or pure nitrogen trifluoride, is eliminated. This removes a significant concern from an operator's perspective. Previous interest in raising the operating temperature with the high pressure thermal etch process were avoided because of the fear of exothermic thermal runaway. The thermal etching process using nitrogen trifluoride is an exothermic reaction. That is, heat is generated by the reaction itself. As the reaction proceeds, this added heat increases the surface temperature at the reaction. This increase in surface temperature results in an even higher etch rate, causing more heat in an escalating fashion as the reaction is allowed to proceed. As a worst case scenario, the reaction has the potential to increase the rate to such a degree that its is possible for it to etch through a quartz process tube, causing an implosion and resultant chemical leak. The present invention, using diluted nitrogen trifluoride, avoids the concern over exothermic runaway, while still allowing use of elevated temperatures comparable to process operating temperatures for the furnace or other tool.

The present invention has been described with reference to a preferred embodiment, however, it should be appreciated that the full scope of the present invention should be ascertained from the claims which follow.

We claim:

1. A process for cleaning materials or equipment surfaces in semiconductor manufacturing using diluted nitrogen trifluoride with minimal reactivity with said materials or equipment and avoidance of condensation of corrosive waste products, comprising:
   (a) initially evacuating a zone contacting said materials or equipment surfaces;
   (b) maintaining said zone at an elevated temperature sufficient to disassociate nitrogen trifluoride;
   (c) flowing a mixture of nitrogen trifluoride and an inert gas through said zone, said mixture in a range of approximately 2%:98% to 70%:30% of the nitrogen trifluoride:inert gas, respectively, wherein said inert gas is selected from a group consisting of nitrogen, argon, helium and mixtures thereof;
   (d) cleaning undesired substances selected from the group consisting of silicon nitride, polycrystalline silicon, titanium silicide, tungsten silicide, refractory metals, refractory metal silicides and mixtures thereof on said materials or equipment surfaces by chemical reaction of said nitrogen trifluoride or fluorine cleaning reagents disassociated from nitrogen trifluoride with said undesired substances to form volatile reaction products, and;
   (e) removing said volatile reaction products, any remaining nitrogen trifluoride and inert gas, as waste products from said zone by subsequent evacuation of the zone wherein said waste products are evacuated through a heated exhaust conduit using a vacuum induced (1) by a pressurized gas vacuum venturi wherein said pressurized gas is heated prior to contacting said waste products; or (2) by a mechanical vacuum pump.

2. The process of claim 1 wherein said elevated temperature is approximately 550° C. to 1000° C.

3. The process of claim 1 wherein said elevated temperature is approximately 600° C. to 900° C.

4. The process of claim 1 wherein said elevated temperature is approximately 620° C. to 850° C.

5. The process of claim 1 wherein said waste products are evacuated to a cold trap wherein said waste products are captured in said cold trap.

6. The process of claim 8 wherein said cold trap is subsequently isolated from said zone and said cold trap is further evacuated to remove said waste products from said cold trap for disposal.

7. The process of claim 5 wherein said waste products are diluted with said pressurized gas.

8. The process of claim 1 wherein said waste products are scrubbed and vented.

9. The process of claim 1 wherein said pressurized gas is selected from the group consisting of nitrogen, argon, helium and mixtures thereof.

10. The process of claim 1 wherein said zone is purged with an inert gas after said subsequent evacuation.

11. The process of claim 1 wherein said initially evacuating is at a pressure of no greater than 200 torr, said flowing a mixture of nitrogen trifluoride and an inert gas is at a pressure of no greater than 750 torr and said elevated temperature is at a temperature of 620°–850° C.

* * * * *

UNITED STATES PATENT AND TRADEMARK OFFICE
CERTIFICATE OF CORRECTION

PATENT NO. : 5,714,011
DATED      : Feb. 3, 1998
INVENTOR(S) : Schneider, et al.

It is certified that error appears in the above-indentified patent and that said Letters Patent is hereby corrected as shown below:

In the Claims:

Column 10, line 48, delete "8" and in its place insert -- 5 --.

Signed and Sealed this

Fifth Day of May, 1998

Attest:

BRUCE LEHMAN

Attesting Officer

Commissioner of Patents and Trademarks